United States Patent [19]

Swift et al.

[11] Patent Number: 5,298,681
[45] Date of Patent: Mar. 29, 1994

[54] FRAME MEMBER AND ASSEMBLY FOR CARRYING ELECTRICAL SIGNALS AND THE LIKE

[75] Inventors: Joseph A. Swift, Ontario; Ross E. Schroll, East Rochester, both of N.Y.

[73] Assignee: Xerox Corporation, Stamford, Conn.

[21] Appl. No.: 871,163

[22] Filed: Apr. 20, 1992

[51] Int. Cl.[5] .......................... H05K 7/02; H02B 1/01
[52] U.S. Cl. ...................................... 174/48; 361/829
[58] Field of Search ................. 174/48, 49, 50, 472 R, 174/72 B, 99 R, 99 B, 250, 251, 255; 361/429; 312/265.1, 265.2, 265.4; 439/61, 110, 210, 215, 216

[56] References Cited

U.S. PATENT DOCUMENTS

| | | | |
|---|---|---|---|
| 3,894,170 | 7/1975 | Schinzel | 174/99 B |
| 3,973,371 | 8/1976 | Heller | 52/280 |
| 4,187,649 | 2/1980 | Chaffee | 52/280 |
| 4,689,726 | 8/1987 | Kretzschmar | 362/127 |
| 4,795,355 | 1/1989 | Dorn et al. | 174/48 X |
| 4,841,099 | 6/1989 | Epstein et al. | 174/258 |
| 4,912,288 | 3/1990 | Atkinson et al. | 174/251 |
| 4,931,326 | 6/1990 | Weil | 174/35 MS |
| 4,970,553 | 11/1990 | Oriowski et al. | 174/258 |
| 4,997,240 | 3/1991 | Schmalzl et al. | 312/265.2 |
| 5,003,693 | 4/1991 | Atkinson et al. | 29/849 |
| 5,003,741 | 4/1991 | Yeh | 52/280 |

Primary Examiner—Timothy V. Eley
Assistant Examiner—Khan V. Nguyen
Attorney, Agent, or Firm—Oliff & Berridge

[57] ABSTRACT

A frame assembly for affording mechanical support and for carrying electrical conduction paths for connection to circuitry of a machine. The frame assembly includes members comprising pultrusions having an insulating body and reinforcing fibers within the insulating body, and has grooves in surface portions along an elongated dimension with conductors in the grooves. The conductors provide electrical conduction paths that are connectable to circuitry of the machine. The pultrusion may be a thermal setting polymer, for example, selected from the group consisting essentially of polyester, vinyl ester, and epoxies, and may be reinforced with fiberglass. The frame member can also have a hollow interior portion within which conductors are arranged to conduct AC power to the circuitry of the machine, and the conductors on the exterior surface of the frame member can be arranged to conduct IIOC bus signals. When a plurality of the frame members are connected together to form a frame assembly, corresponding conductors of each are interconnected to facilitate supplying and directing the electrical signals to the machine. The connections can be made to and among the electrical conductors carried by the pultrusions by blocks that are attachable to the pultrusions.

76 Claims, 13 Drawing Sheets

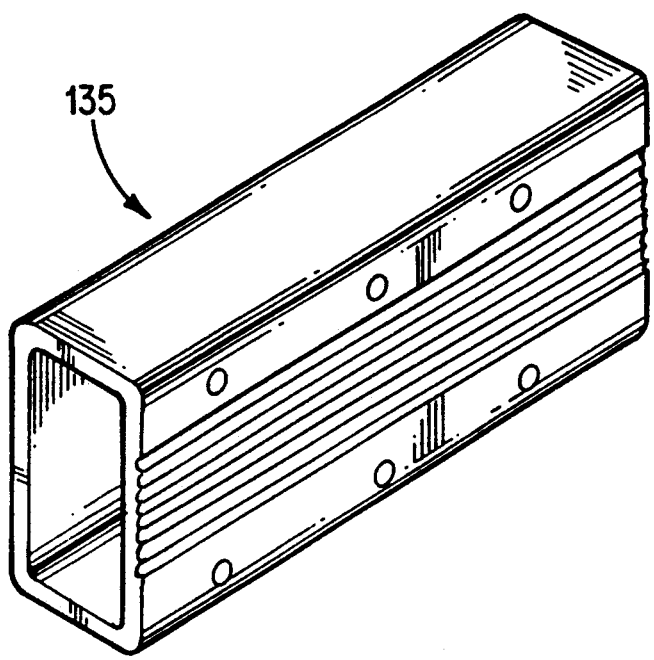
FIG. 9
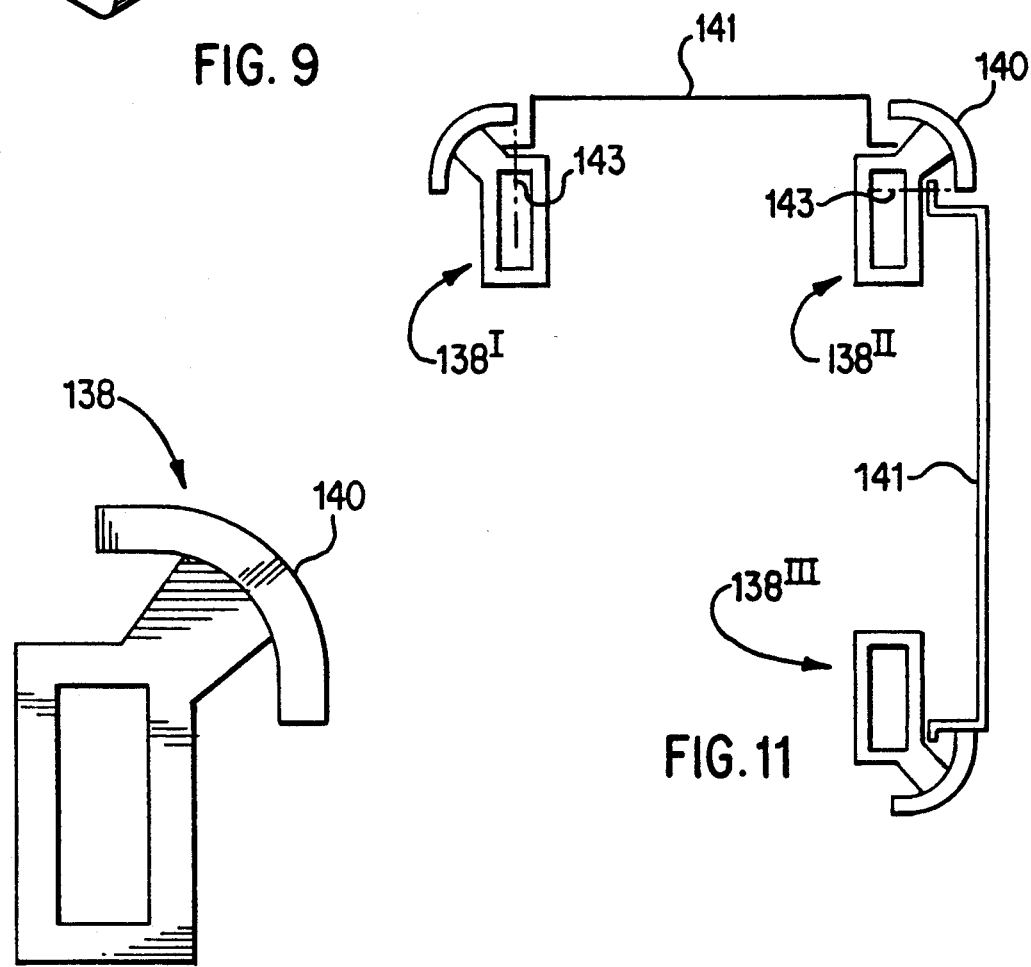
FIG. 10
FIG. 11

- - - - - - INSIDE NET
— — — OUTSIDE NET
— · — TOPSIDE NET

FRAME MEMBER AND ASSEMBLY FOR CARRYING ELECTRICAL SIGNALS AND THE LIKE

BACKGROUND OF THE INVENTION

This invention relates to improvements in structural frame embers and assemblies, and more particularly to improvements in frame members and assemblies for use in conjunction with machines requiring electrical circuit interconnections, and still more particularly to improvements in frame members and assemblies of the type which are capable of conducting electrical signals, voltages, and the like, to and from the circuitry of an associated machine.

Although the invention has wide applications, as will become apparent, a preferred embodiment of the invention is particularly suitable for applications in electrostatographic reproducing machines. In a typical electrostatographic reproducing machine, a photoconductive insulating surface, often in the form of a moving belt, is uniformly charged and exposed to a light image from an original document. The light image causes the exposed or background areas to become discharged, and creates an electrostatic latent image on the surface corresponding to the image contained within the original document. Alternatively, a light beam such as a laser beam may be modulated and used to selectively discharge portions of the photoconductive surface to record the desired information thereon. The electrostatic latent image is made visible by developing the image with a developer powder, referred to in the art as toner, which may be subsequently transferred to a support surface such as paper to which it may be permanently affixed by the application of heat and/or pressure.

In these commercial applications, it is of course necessary to distribute electrical power, high voltage and/or logic signals between the various units, subsystems, customer replaceable units and/or cartridges of the machine. Traditionally, this has been accomplished utilizing conventional wires and wiring harnesses in each machine to distribute power and logic signals between, for example, the main processor and frame of the machine and a removable processing unit. For instance, conventional plug and socket arrangements have been used which can be either manually connected or joined automatically on insertion of the unit into the main processor. Such automatic joining requires precision positioning and alignment of the unit on insertion with very low tolerance for error. Typically locating members such as pins or rails are used to insure proper positioning, all of which adds to the manufacturing cost of the machine. In addition, conventional wires and wiring harnesses are flexible and therefore, do not lend themselves to automated assembly such as with the use of conventional robots further leading to increased manufacturing costs.

In many typical copier systems, flexible interconnects have been accomplished by such techniques as flexible ribbon wires with plugs that attach to mating plugs on the members to be interconnected. Such ribbon wiring arrangements, however, do not lend physical support between the interconnected members, and also often involve intensive labor fabrication requirements. Furthermore, such harnesses may have to be handled or moved several times to make all connections required. This is a highly labor intensive task, frequently requiring routing of the several harnesses through channels and around components manually with the final connections being also accomplished manually, thereby resulting in potential human error in the assembly, which might be reduced with the use of automated and in particular robotic assembly. Conventional harnesses also often require chafe protection, standoffs, and tie wraps which further add to the assembly and installation costs. In addition to the relatively high labor costs associated with electrical harness construction and installation, it is well to note that such wiring harnesses are less than totally reliable in producing their intended function. Furthermore, and with increasing sophistication of the capabilities of such products, a plurality of wiring harnesses may be required in any individual machine which can require a large volume of space thereby increasing the overall size of the machine. Accordingly, there is a desire to provide an alternative to the conventional wiring and wiring harnesses that overcomes these difficulties.

One of the considerations for the development of wiring harnesses and interconnects in electrostatic copier environments is the relatively hostile machine surroundings having surfaces possibly contaminated by dirt, toner, silicone oil, or other debris. Furthermore, metal contacts that might be used often tend to oxidize forming an insulating layer on the contact surface thereby further degrading the reliability and performance of the contact and of the machine. Such contacts, therefore, need to be either improved or minimized.

To address these and other problems, and with recent emphasis toward the goal of replacing conventional wire harnesses in copier products to achieve a so-called "wireless copier", what is needed is the incorporation of circuit functions directly into large structural machine parts. For example, the surfaces of machine covers, frames housings, support brackets, bases, and the like, can all provide vacant "real estate" for circuitization, given that the substrate materials are, or can be made, insulating and can be appropriately "circuitized".

New manufacturing processes are likely to be required for efficient and economical patterning, plating, and component loading of the large multifunctional parts envisioned for copiers of the future. Also required will be new materials and methods to construct key structural members.

What is needed is the identification of new materials and fabrication techniques by which structural frames having integrated electrical interconnect features can be provided.

REFERENCES

U.S. Pat. No. 4,689,726 to Kretzschmar discloses a lighting system for an adjustable shelf system. The lighting system comprises a fixture laterally extending along a shelf, the shelf being adjustably positionable along a combination electrical conductor and shelf positioner. The fixture includes an electrically conductive strip. By use of this design, no wiring is needed within the structure of the bookshelf.

U.S. Pat. No. 4,997,240 to Schmalzl et al. discloses a modular housing system for electronic equipment. The housing system consists of capping pieces of extruded sections provided with keyhole shaped guide grooves in a longitudinal direction that are modularly joined with corner nodes and connector elements adaptable for respective utilization.

U.S. Pat. No. 5,003,741 to Yen discloses a structure of multifunction frame members. A tubular member of octagonal shape is provided on its outer sides with dovetail slots and on its inside with opposed longitudinal engaging surfaces. A connector is in the form of a support with orthogonally disposed legs that can be received in the octagonal tube. A frame may be made up from a number of the tubes and connectors and numerous other fittings may be provided which fit in the dovetail slots.

U.S. Pat. Nos. 4,912,288 and 5,003,693, both to Atkinson et al., disclose methods of providing an electrical circuit molded within a three-dimensional plastic substrate by the application of heat and pressure.

U.S. Pat. Nos. 4,841,099 and 4,970,533, to Epstein et al. and Orlowski et al., respectively, and both assigned to the assignee of the present invention, disclose a three-dimensional electrical component made from an electrically insulating polymer matrix which is capable of heat conversion to electrically conductive fibrous filler to provide a conductive trace on the component. A structural frame of a copier is shown having electroconductive paths.

U.S. Pat. No. 3,973,371 to Heller discloses an apparatus and system for constructing a skeletal framework out of extruded aluminum members adapted to support wall, furniture or other structural panels. The apparatus includes a plurality of elongated channel members, each having a generally rectangular cross section, one side which defines an axial slot. A cover for this side is also provided which when put together with the channel member gives a complete skeletal frame member. A plurality of spline members are provided to interconnect the frame members at their ends. The recesses provided by the structural framework support structural panels to provide an interior wall or furniture piece.

U.S. Pat. No. 4,187,649 to Chaffee discloses a frame construction adapted for the use in framing panels and forming parallelepiped configurations. The frame is constructed out of a metallic material and is comprised of tubular frame members and corner connectors.

U.S. Pat. No. 4,931,326 to Weil discloses a reinforced flexible plastic tubing and method of manufacture. The tubing is a composite tubular device comprising a flexible, hollow, plastic tube and a flexible, hollow, tubular, porous member at least substantially embedded in the plastic tube. The tubular member should both have an outer and an inner side as well as macroscopic pores substantially uniformly distributed around and along the tubular member. Before the member is incorporated into the composite tubular device, the plastic of the tube is extended through a multiplicity of the pores between the inner and outer sides of the tubular member.

SUMMARY OF THE INVENTION

In light of the above, it is, therefore, an object of the invention to provide a frame member for affording mechanical support and for carrying electrical conduction paths for connection to circuitry of a machine.

It is another object of the invention to provide a frame assembly constructed from a number of similar frame members of the type described, for use in carrying a machine or machine components.

It is another object of the invention to provide a frame member of the type described which enables fully automated frame assembly construction, including the installation of integrated Input Output Connector (IIOC) modules and other interconnecting connectors.

It is yet another object of the invention to provide a frame assembly of the type described which reduces wiring harness requirements, particularly in reprographic copy machines.

It is yet another object of the invention to provide a frame member of the type described which is of extremely high reliability, due to extent of integration possible and use of auto assembly processes.

It is still another object of the invention to provide a frame member and frame assembly including it in which AC conductors can be located on interior surfaces of the structure, reducing shorting and safety hazards as well as providing ready access for module mounting and interconnection.

It is still another object of the invention to provide the electrical buss/wires (net) that are interconnected to the IIOC module to derive its f unction. Other DC signals may be provided on the frame members.

It is still yet another object of the invention to provide a frame member and frame assembly in which frame member joining modules can be provided with programming capabilities to create unique IIOC networks.

By virtue of the present invention, new materials and fabrication techniques which result in structural frames having integrated electrical interconnect features can be provided. More particularly, a "Smart Frame" concept is disclosed which can be used as the basis for comprehension of, as well as for the construction of a commercially viable "wireless copier" architecture for mid and high volume copiers and other electrical and electronic products. By means of such "Smart Frame" concepts, integration of electronic functions into traditional machine frame members can be easily realized by which additional layers of multifunctionality of the frame members are enabled by the various frame member configurations described below.

Thus, in accordance with a broad aspect of the invention, a frame member is provided for affording mechanical support, and for carrying electrical conduction paths for connection to circuitry of a machine. The frame member is comprised of a pultrusion having an insulating resin binder and reinforcing fibers within the insulating resin binder. The pultrusion has grooves in surface portions along an elongated dimension with conductors in the grooves. The conductors provide electrical conduction paths that are connectable to circuitry of the machine. The pultrusion may be a thermal setting polymer, for example, selected from the group consisting essentially of polyester, vinyl ester, and epoxies, and, preferably, may be reinforced with fiberglass.

The reinforcing fibers can be conductive fibers, such as conductive carbon fibers, metalized carbon fibers, or the like, that may be contained in the pultrusion aligned perpendicularly to the elongated dimension, and in one embodiment, additionally can be arranged in planes substantially perpendicular to the elongated dimension.

The frame member, in one embodiment, has a hollow interior portion within which conductors can be arranged to conduct AC power to the circuitry of the machine, and the conductors on the exterior surface of the frame member can be arranged to conduct IIOC bus signals and low voltage power.

The frame member, in another embodiment, includes a semi-cylindrically shaped member formed by the pultrusion that serves as a corner member on an external periphery of the machine. The corner member can be aesthetically colored and textured, and arranged to secure an external machine cover.

A plurality of the frame members, in accordance with still another embodiment of the invention, are provided with grooves and conductors corresponding ones of which can be interconnected to facilitate supplying and directing the electrical signals to the machine. The connections can be made to and among the electrical conductors carried by the pultrusions by blocks that are attachable to the pultrusions, in one embodiment of "T" shape.

BRIEF DESCRIPTION OF THE DRAWINGS

The invention is illustrated in the accompanying drawings, in which:

FIG. 9 is an isometric view of a pultruded frame member having a single electrical bus array in accordance with another preferred embodiment of the invention;

FIGS. 10 and 11 are top diagrammatic views of another pultruded frame member of configuration suitable for presenting decorative features for use in external or publicly visible portions of a frame assembly as well as for providing securing capabilities for machine enclosing panels or the like.

Figure 1A:
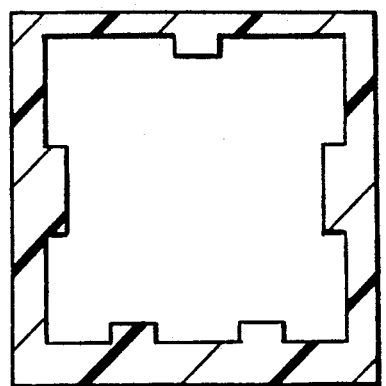
FIGS. 1a-1e are cross sectional views of various pultrusion shapes which are exemplary of shapes suitable for practicing the invention.

In the various figures of the drawings, the sizes and dimensions of the parts are not necessarily to scale and have been exaggerated or distorted in some instances for clarity of illustration and ease of description. In addition, in the various figures, like reference numerals are used to denote like or similar parts.

DETAILED DESCRIPTION OF THE PREFERRED EMBODIMENTS

Although the invention in its broad aspect has many applications, in accordance with one aspect of the present invention a frame assembly is provided for use in machine constructions, in general, and reprographic copy machine constructions, in particular. The frame assembly is formed of pultruded frame members interconnected by joining members of various shapes or configurations. Still more particularly, the individual frame members are pultruded composites, such as those routinely manufactured by commercial vendor sources such as the MMFG Company of Bristol Virginia as linear shapes that use continuous filament reinforcement. Such pultruded composites are easily capable of achieving mechanical properties that can match, or in many cases, exceed those of most metals. Usually, pultrusions are fabricated from a thermal setting polymer matrix, such as a polyester, a vinyl ester or an epoxy resin, formulated to meet specific chemical, flame retardant, electrical, and environmental requirements, containing, at least one type of fiber reinforcement filler, such as fiberglass, polyester fiber, carbon fiber, and ceramic fiber being among those most widely used. Individual conductive traces provided on one, or more, surfaces of the pultruded frame members for selective interconnection with the conductive traces of other pultruded frame members, comprise the circuitry of the machine with which the frame is associated to interconnect signals or voltages, or the like.

The pultrusions by which the frame members are formed can be of pultruded square, or rectangular, or any other suitably shaped tubular, straight, or right angle, configured sections, and may include molded corner, "T", and spline sections to join the pultruded members into solid frame structures. The frame members can also be attached to each other or the joining members through the use of adhesives, ultrasonics, heat fusing, or other securing techniques suitable to the materials being joined. Moreover, multiple power and logic circuits can be incorporated within or upon the surfaces of the pultruded sections, and, if desired, a means to place through-hole interconnects in the walls of the pultrusions can be provided to enable IIOC's and other Input/Output (I/O) connectors to be connected to the signal/power runs.

Figure 1B:
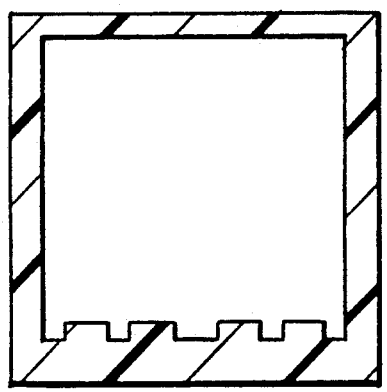

For example, as shown in FIGS. 1a-1e, the frame member can assume various embodiments, such as those characterized by any of a number of cross sectional shapes, and provisions such as grooves or the like can be made, if desired as shown, to provide conductor paths along virtually any surface of the pultrusion, for instance, on interior surfaces, as shown in FIGS. 1a and 1b exterior surfaces, as shown in 1d, or both interior and exterior surfaces, as below described. The lengths of the frame members can be 10 or more feet long if desired, to carry thin (for example of thickness between about 0.002-0.050 inch) conductor strips, such as of copper foil co-pultruded together or alternately adhesively joined together with the polymer matrix to form the desired configuration. The widths of the conductor strips can be adjusted, for instance, to form wider power buses or narrower signal traces.

Figure 1C:
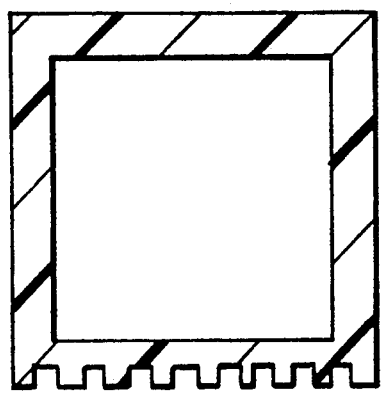
Figure 1D:
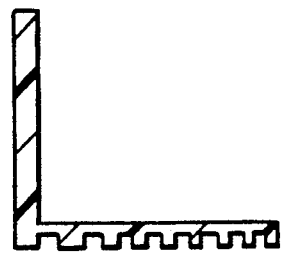
Figure 1E:
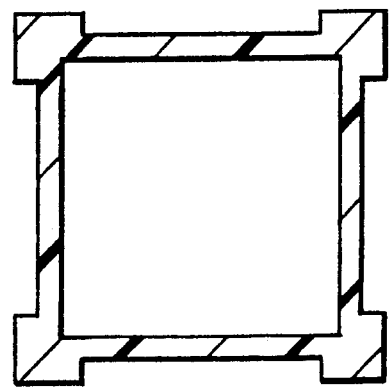

FIG. 1c illustrates an embodiment wherein an array of, for example, eight conductor strips are provided on an exterior surface. In this embodiment, the conductor strips can be approximately 0.070 inch wide, the conductor strips having approximately 0.030 inch wide insulator strips provided therebetween.

Figure 2:
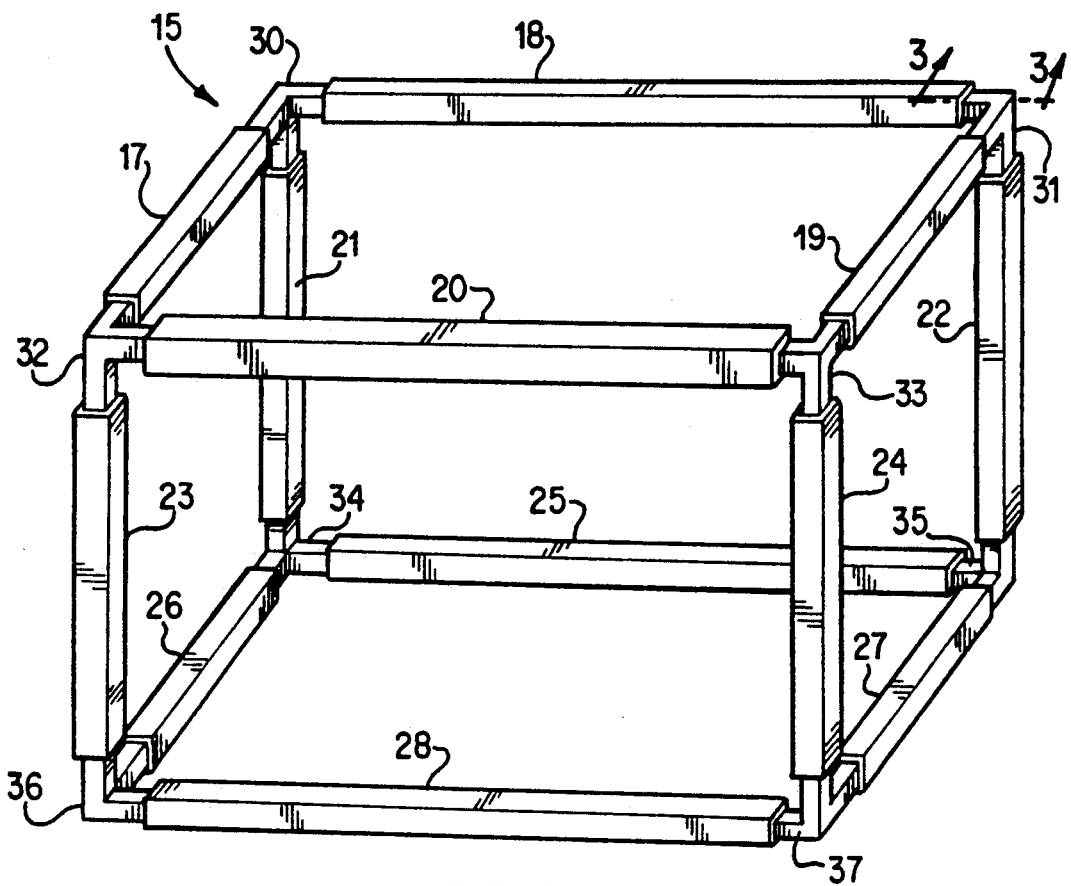
FIG. 2 is an isometric view of a machine frame having interconnected pultrusion elements, in accordance with a preferred embodiment of the invention.
Figure 3:
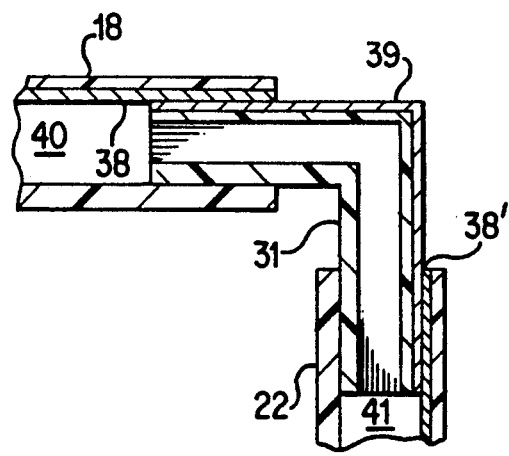
FIG. 3 is a cross sectional view of a corner connection of the machine frame, taken at 3—3 in FIG. 2.
Figure 6A:
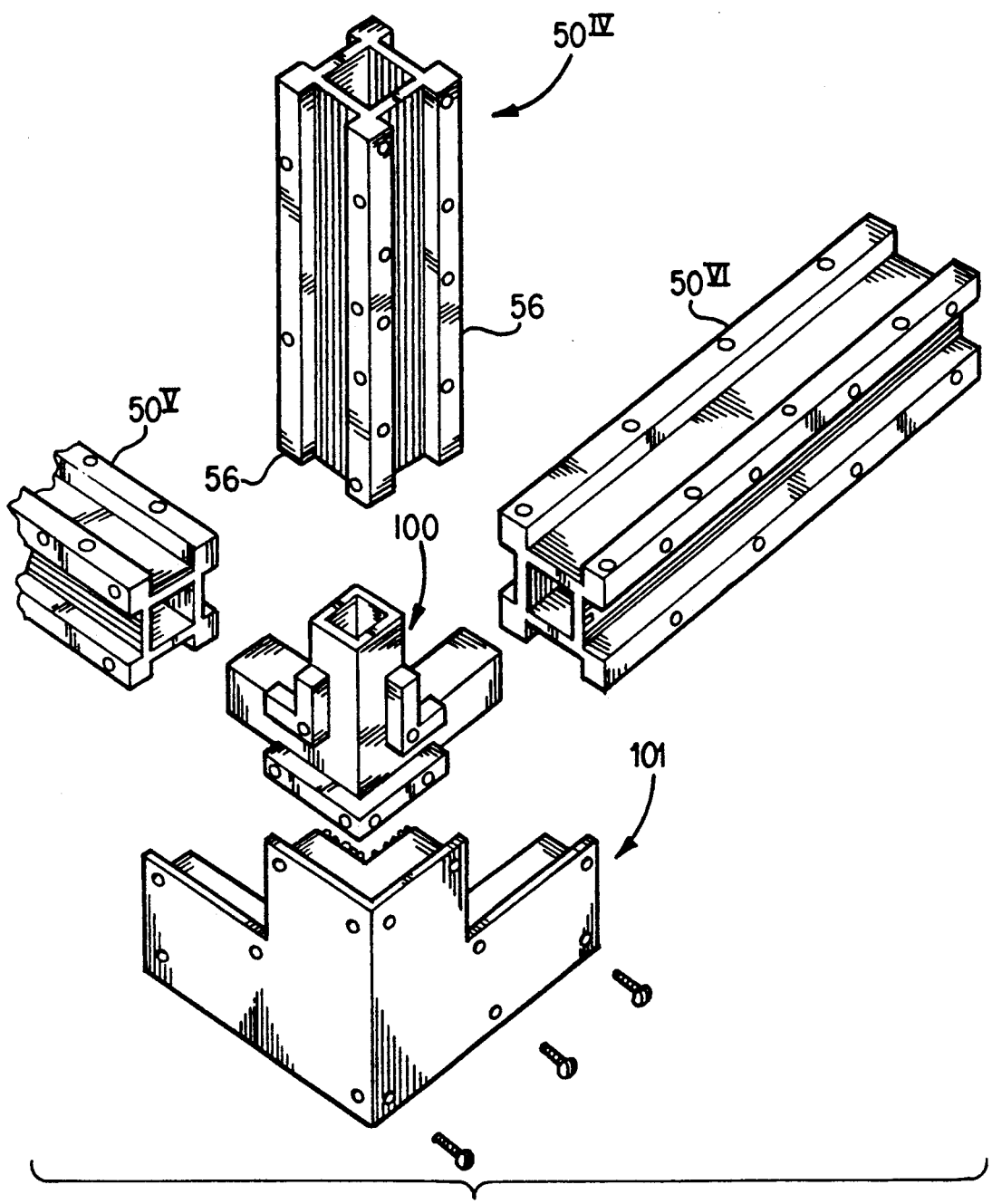
FIG. 6a is an exploded isometric view of a first embodiment of a corner interconnection of three pultruded frame members of the type shown in FIG. 4.

One frame assembly embodiment 15 in accordance with the invention is shown in FIG. 2, and is constructed with pultruded frame members 17-28 carrying circuit bus and power conductors (not shown) running continuously along the periphery of at least one surface of the structure. Corner joining members 30-37 mechanically interconnect the pultruded frame members 17-28, and also establish electrical connections between selected ones of the circuit bus and power conductors carried on the pultruded frame members. Interior corner encoder 1 01 as illustrated in FIG. 6a is selectively connected to external conductors to create desired nets. An enlarged view of a corner connection, taken at section 3—3 in FIG. 2 is shown in FIG. 3, illustrating an arrangement in which circuit paths 38 and 38' are located on the inner walls 40 and 41 of the respective pultruded frame members 18 and 22 to be interconnected by a conductor 39 on the outer walls of the corner section 31. The corner member 31 has a good interference fit, but nevertheless may be secured in a permanent position by adhesive, or thermal bonding, or by ultrasonic welding of the plastic and/or metal members or by screws or other appropriate fasteners (not shown). The Conductors shown can be joined by soldering, snap fits, conventional welding, ultrasonic welding or other suitable electrical joining techniques.

As described below in detail, connections may be established to the conductors of the pultruded frame members 18-27 or the various corner connectors 30-37 at virtually any desired location along their lengths to facilitate conduction of the desired selected signals or voltages to the various machine parts which may be carried within or by the frame assembly 15. As will become apparent, such connections can be established by connection blocks, screws, pins, or other means, depending upon the particular embodiment employed.

In the embodiment illustrated, the circuit bus and power conductors can be of any suitable electrically conducting material, such as copper or other suitable metal plated or otherwise formed on the desired surfaces of the pultrusions as described above. Alternatively, the frame members can be formed through known techniques for forming electrically conductive paths in a polymer matrix which is filled with electrically insulating fibers that are capable of heat conversion to electrically conducting fibers. By such technique, by selectively heating the filled polymer matrix the electrically conductive paths can be formed in situ in selected regions of the individual frame members 17-28.

Such a technique may be performed, for example, by providing an electrically insulating polymer matrix which will form a frame member, loaded or doped with a suitable polymeric fibrous material capable of heat conversion to conductive fibrous carbon within the polymer matrix. Examples of suitable fibrous filler are cellulose (rayon), petroleum pitch based carbon fibers which are heat convertible carbonaceous fibers, and thermally stabilized, polyacrylonitrile fibers. The fiber filled polymer matrix doped with such fibers can be formed into the desired frame member configuration by conventional injection molding, extrusion, or pultrusion techniques, then selectively heated, preferably by a laser such as a carbon dioxide laser, to convert the electrically insulating fibrous filler to an electrically conductive filler along the desired paths. Thus, directing the laser beam onto the selected portions of the polymer matrix to be pyrolyzed results in melting the polymer and heat converting the electrically insulating fibers to electrically conductive fibers to form the required conductive paths.

Figure 4:
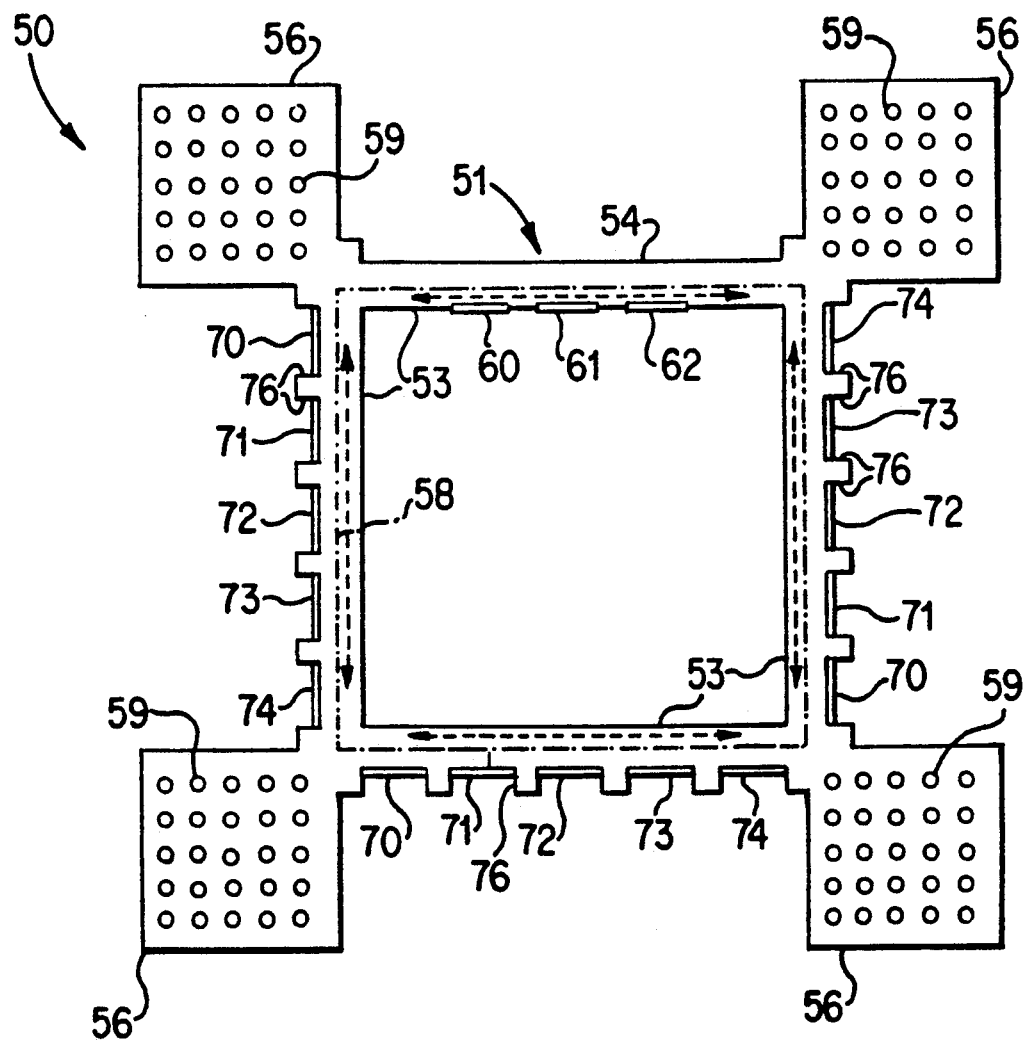
FIG. 4 is a top view of a pultruded frame member, in accordance with a preferred embodiment of the invention.
Figure 5A:
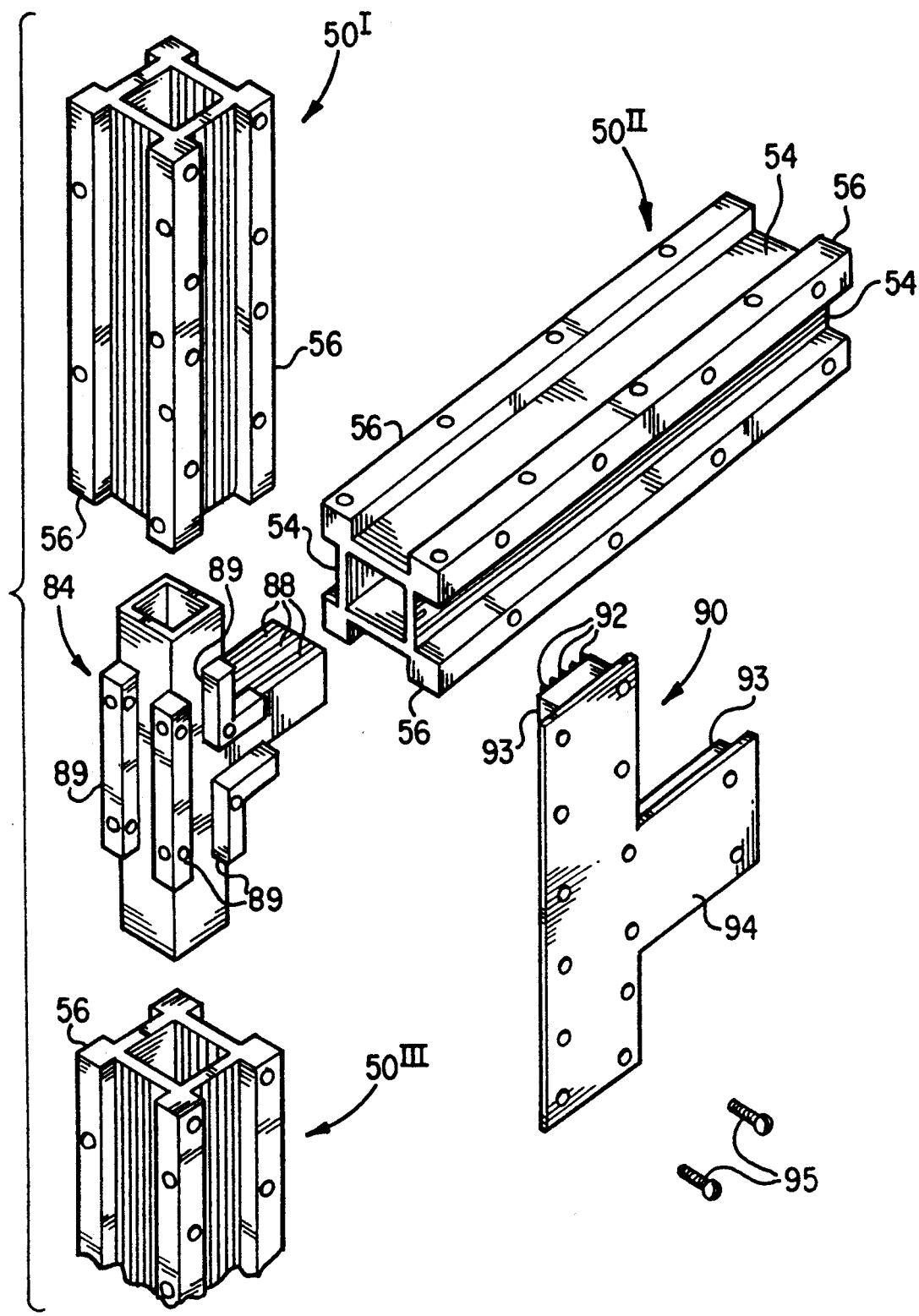
FIG. 5a is an exploded isometric view of a first embodiment of a "T" interconnection of three pultruded frame members of the type shown in FIG. 4.

In accordance with a preferred embodiment of the invention, a number of similarly constructed pultruded frame members can be provided, each contributing a substantially identical "building block" that can easily and selectively be interconnected to adjoining building blocks. One configuration for such building block frame members and frame assemblies formed therewith is shown in FIGS. 4 and 5a. As can be seen from the details of the end view of a typical pultruded frame member 50 shown in FIG. 4, the pultruded frame member 50 is of generally square or rectangular shape, having a similarly shaped square or rectangular core 51 with enclosed inner surfaces 53 and exposed outer surfaces 54. Square corner members 56 are provided as shown to enable physical connections to be made to the frame member 50, such as by screws, or the like, affixed to standard hole patterns created in the frames. The holes can also be used to mount mechanical sub-systems, provide screw holes for the joining and programming modules (described below), and for mounting signal bus or other connectors.

The matrix of the pultruded frame member 50 contains continuous fiber strands to resist stresses of tension, compression, and bending of the part, plus, continuous strand mat to reinforce surfaces and prevent lineal splitting and chipping from impact. In the embodiment illustrated, one or more filament winding processes is employed to provide for fiber rich inner and outer layers where a portion of the continuous fiber reinforcement 58 in these layers is aligned perpendicular to an elongated dimension of the frame member 50. Moreover, the square corner member 56 carries reinforcing continuous fibers 59, predominantly oriented lengthwise along the elongated dimension of the pultruded frame member 50. The reinforcing fibers 59 can be conductive fibers, for example, conductive carbon fibers, metalized carbon fibers, or the like. In order to prevent shorting of electrical runs from occurring, not all of the fibers should be conductive. Preferably, however, at least 5% by weight of the fibers should be conductive fibers. Further, the use of carbon is effective in building stiffer frame structures than frame structures obtained, for example, by using fiberglass alone.

As shown, three conductors 60, 61, and 62 are provided on one of the inner surfaces 53 of the frame member 50 to serve as power conductors for the AC bus, and five conductors 70-74 are provided in grooves on three of the outer sides 54 of the frame member 50 to provide a signal bus, such as an IIOC bus. It should, of course, be noted that although three redundant sets of bus conductors are provided on three sides of the frame member 50 to enable convenient routing and connection of the bus conductors, the conductors on each of the three sides can be provided for separate or independent functions as may be desired.

As mentioned, the pultruded frame member 50, constructed as described above, provides a basic building block from which a machine frame having a convenient wiring configuration can easily be assembled by interconnecting several of the building block frame elements. Thus, as shown in FIG. 5a, three frame members $50^I$, $50^{II}$ and $50^{III}$, of similar construction to the frame member 50 described above are provided for interconnection at a "T" junction. A "T" shaped molded corner section 84 is constructed by conventional insert molding techniques, and is provided having copper circuit runs 88 configured to mate with the AC power conductors 60–62 in the interior of the individual frame members $50^I$–$50^{III}$ when the legs of the "T" shaped member 84 are inserted into their interior portions. Rails 89 are attached to the body of the "T" shaped molded corner section 84 to contact the mating corner members 56 of respective ones of the pultruded frame members $50^I$, $50^{II}$, and $50^{III}$, and, if desired, the rails 89 may be provided with interior continuous reinforcement fibers (not shown). The reinforcing fibers can be conductive fibers, for example, conductive carbon fibers, metalized carbon fibers, or the like to electrically contact the fibers 59 within the corner members 56, for example to establish a ground or noise isolation capability within the frame members 50.

The conductors 70–74 on the outer surfaces of the members $50^I$–$50^{III}$ are interconnected by one or more "T" shaped connector 90. The "T" shaped connector 90 has a number of conductors or wires 92 mounted onto a block 93, in turn carried by a "T" bracket or backing plate 94. The components of the "T" shaped member 90 are of such dimensions that when the backing plate 94 is attached to the corner members 56 and rails 89, such as by screws 95 or the like, the block 93 brings the conductors 92 into contact with respective ones of the conductors 70–74 on the outside surfaces 54 of the pultruded frame members $50^I$, $50^{II}$, and $50^{III}$. if desired, programming of bus routing can be accomplished by drilling or punching out various selected ones of the conductors 92 prior to attachment of the "T" shaped connector 90; therefore, the "T" shaped connector 90 serves not only physical and electrical interconnection functions, but enables programming of bus routing as well.

Figure 5B:
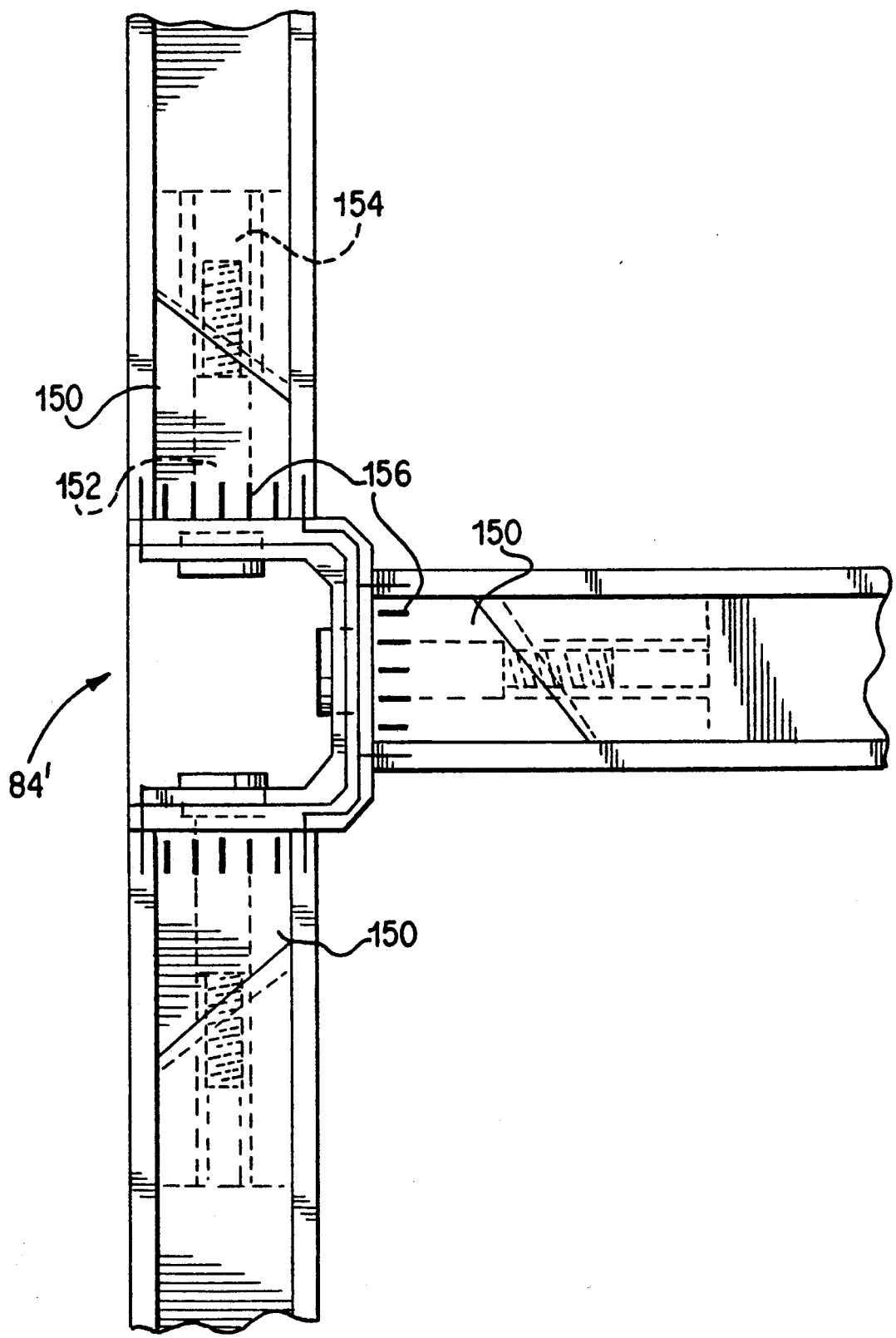
FIG. 5b is a view of a second embodiment of a "T" interconnection module assembly.

FIG. 5b illustrates another embodiment of a "T" interconnection module assembly for use in conjunction with the present invention. A "T" connector 84' has legs 150 which are inserted into interior portions of frame members. The "T" connector 84' has bolts 152 extending through legs 150. Wedges 154 in the frame members mate with bolts 152. As illustrated by reference numeral 156, in the FIG. 5b embodiment, conductors of the frame members are soldered all around within each leg 150 of "T" connector 84'.

Figure 5C:
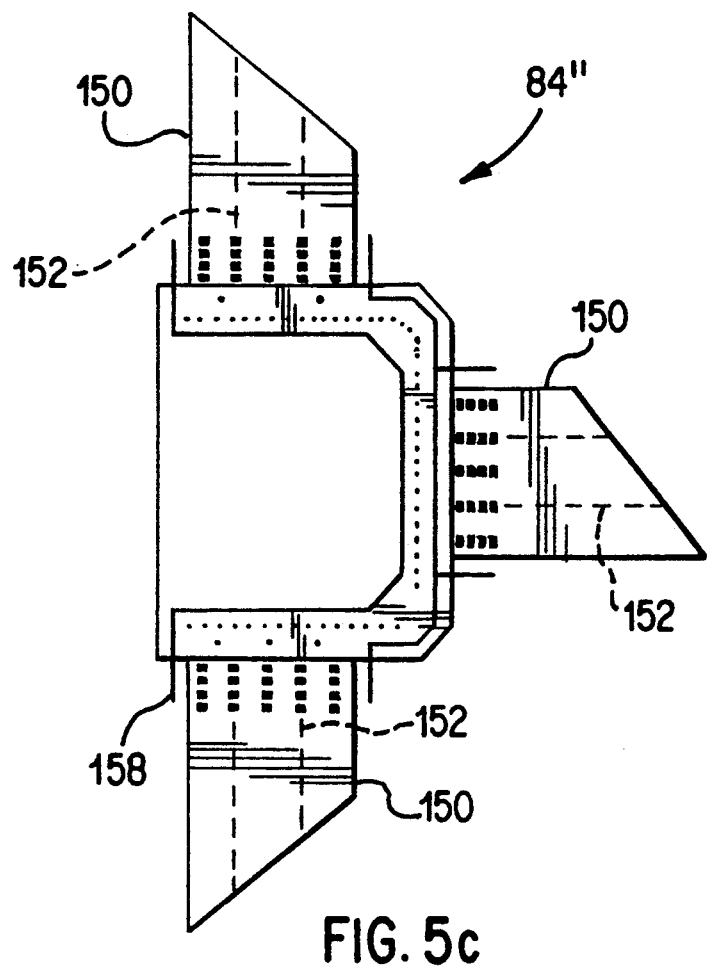
FIGS. 5c and 5d are two views of the second embodiment of the "T" interconnection in accordance with the present invention referenced in FIG. 5b.
Figure 5D:
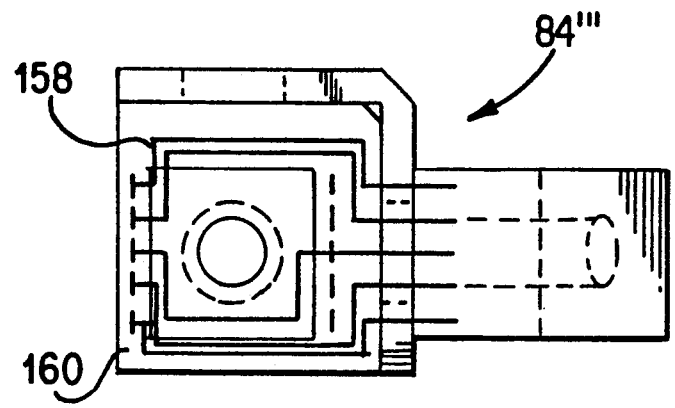

FIG. 5c illustrates a "T" connector 84" for use in conjunction with the present invention. The "T" connector 84" includes a molded conductor pattern 158 mounted therein. Conductor pattern 158 enables "T" connector 84" to serve as both a physical and electrical interconnection. FIG. 5d illustrates a "T" connector 84''' wherein molded conductor pattern 158 is insert molded in glass 160.

A corner construction for a frame assembly, in accordance with a preferred embodiment of the invention, for the interconnection of three pultrusion frame member building blocks $50^{IV}$, $50^V$, and $50^{VI}$ is shown in FIG. 6a. The corner connection shown in FIG. 6a is similar to the "T" connection described above with reference to FIG. 5b, except for the differently configured base corner 100 and connection bracket 101.

Figure 6B:
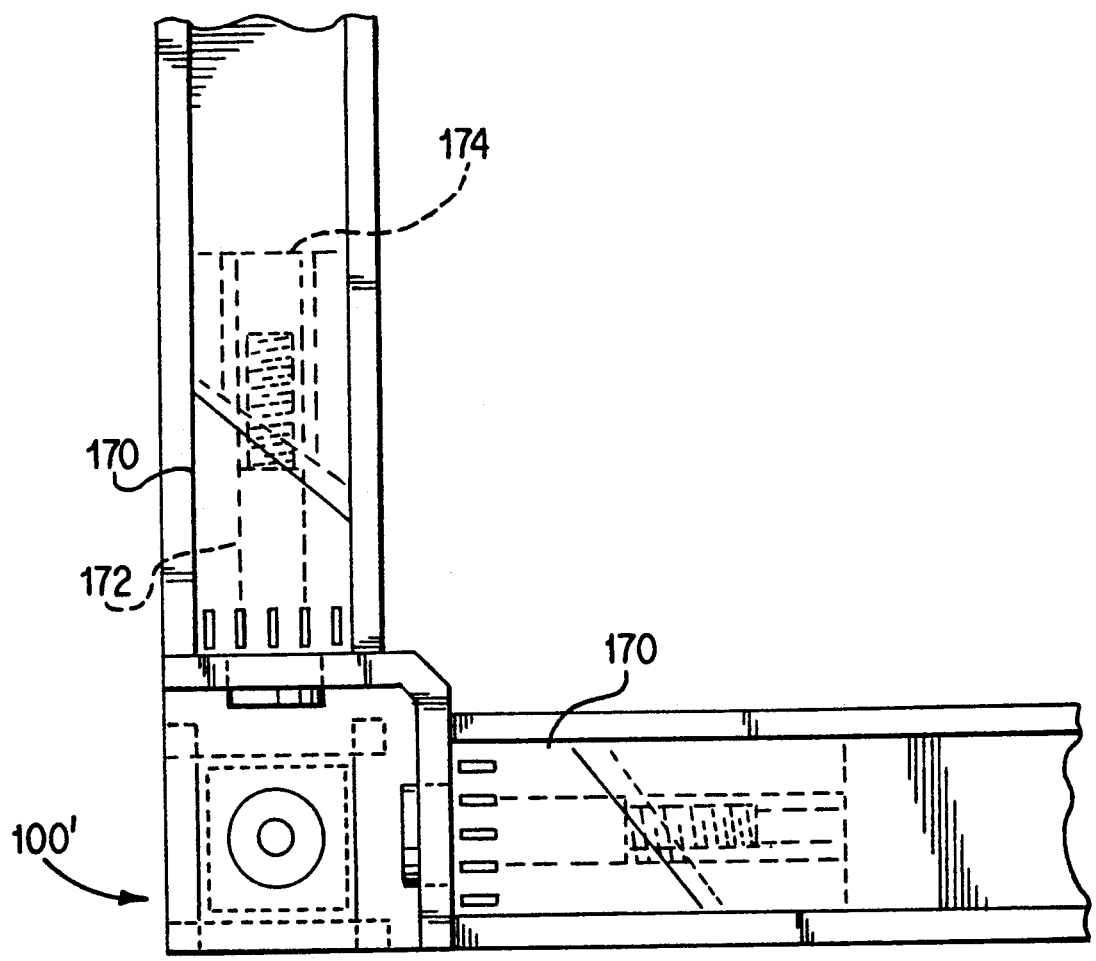
FIG. 6b is a view of another embodiment of a corner module assembly.

FIG. 6b illustrates another embodiment of a corner module assembly for use in conjunction with the present invention. Corner module 100' is similar to "T" connector 84'. Corner module 100' has legs 170 which are inserted into interior portions of frame members. Corner module 100' has bolts 172 extending through legs 170. Wedges 174 in the frame members mate with bolts 172. As illustrated, in the FIG. 6b embodiment, conductors of the frame members are soldered all around within each leg 170 of corner module 100'.

Figure 6C:
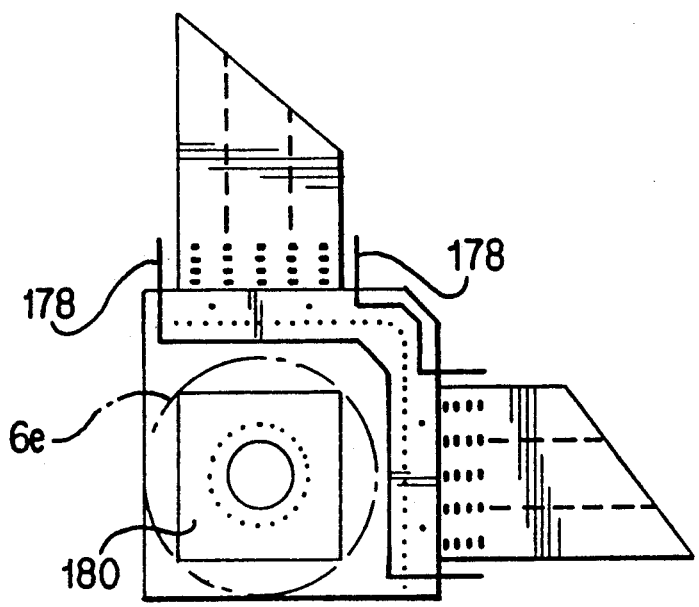
FIGS. 6c and 6d are two views of the second embodiment of corner modules used in accordance with the present invention referenced in FIG. 6b.
Figure 6E:
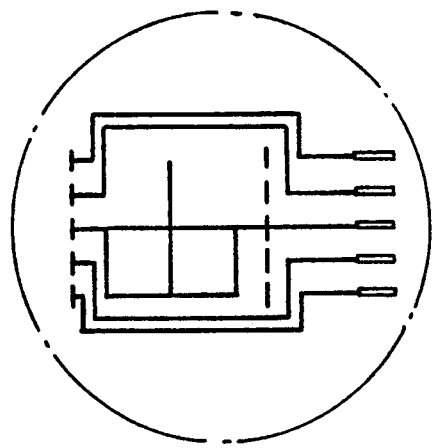
FIG. 6e is an exploded view of a vertical conductor pattern of FIG. 6c.
Figure 6D:
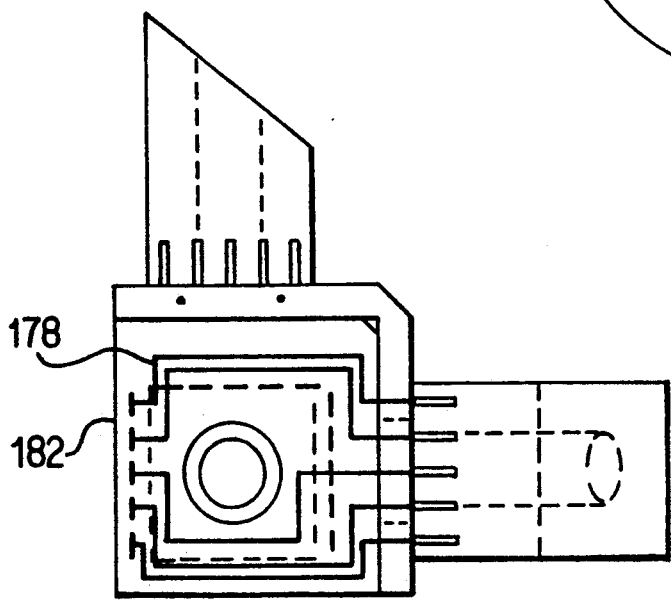

FIG. 6c illustrates a corner module 100" for use in conjunction with the present invention. Corner module 100" includes a molded conductor pattern 178 mounted therein. An exploded view of member 180 illustrates a vertical conductor pattern within member 180. FIG. 6d illustrates a corner module 100''' wherein molded conductor pattern 178 is insert molded in glass 182.

Figure 7:
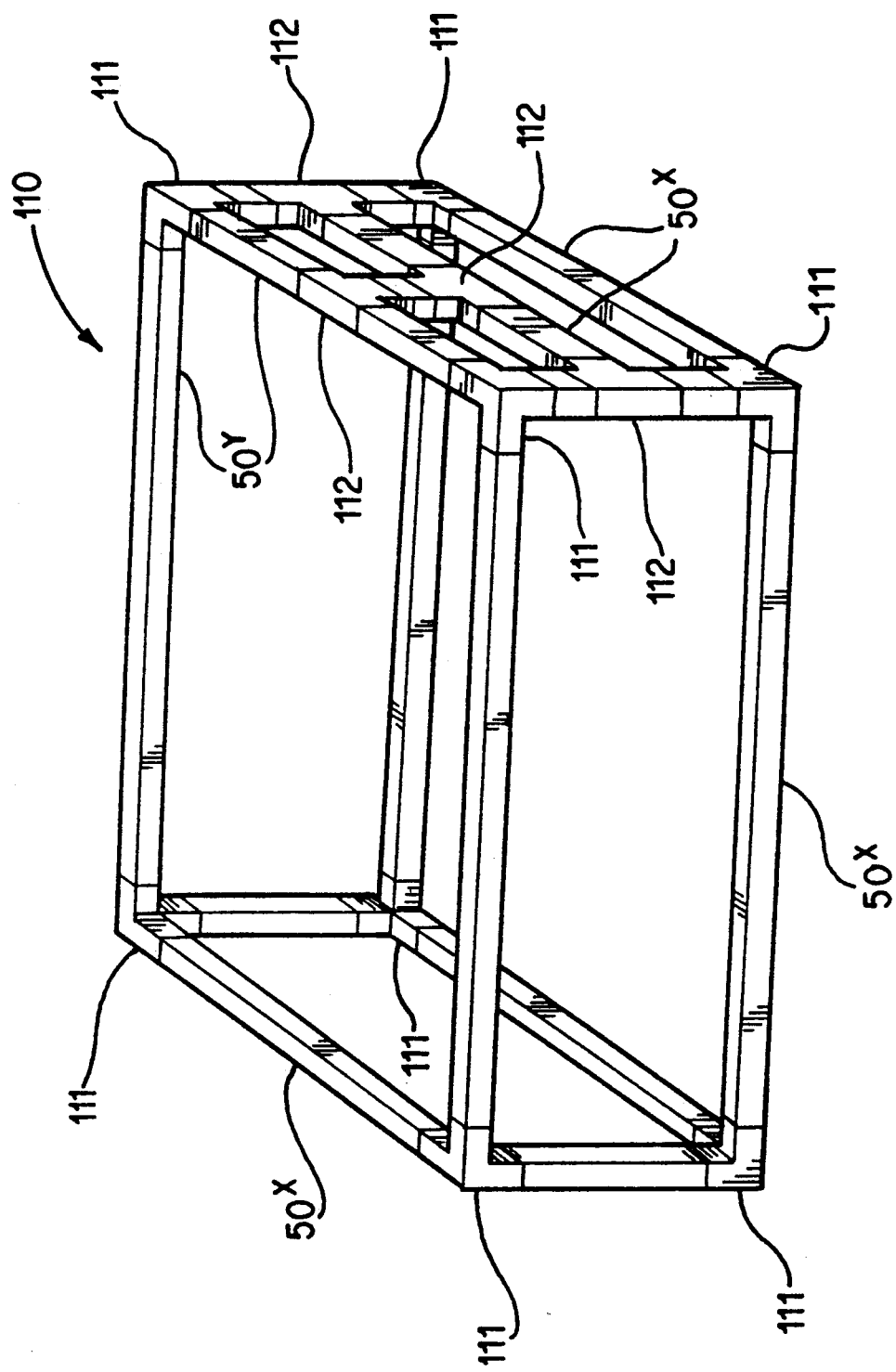
FIG. 7 is an isometric view of a completed frame assembly using a number of pultruded frame members of FIG. 4 and "T" and corner-interconnections of FIGS. 5 and 6.

By provision of the corner and "T" sections described, the construction of a complete machine frame, such as the frame 1 10 shown in FIG. 7 can be envisioned by joining appropriate lengths of building blocks $50^X$ together at corner junctions 111 and "T" junctions 112.

Figure 8:
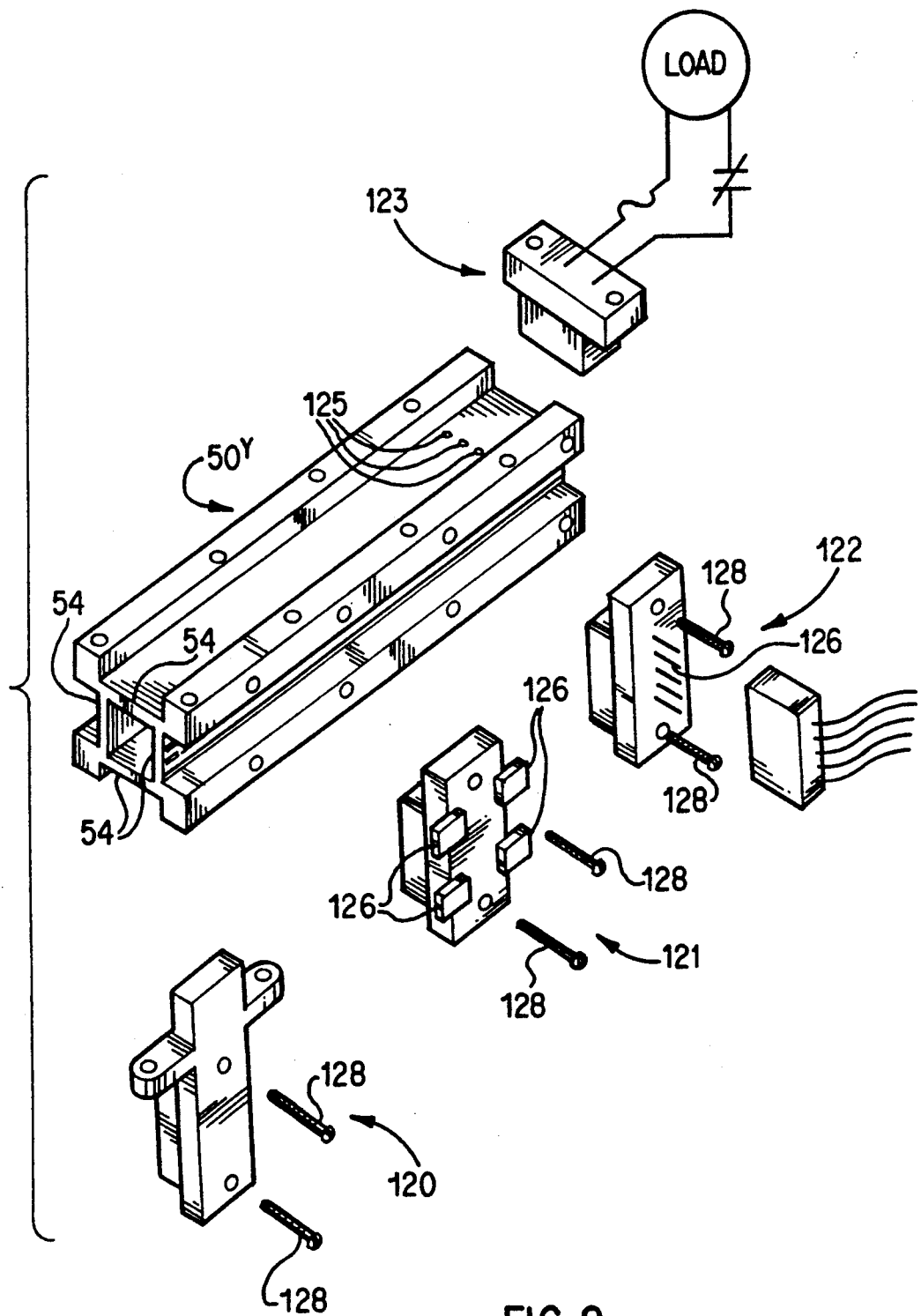
FIG. 8 is an isometric view of a frame member with various connectors which can be used to establish electrical contact to the various conductors of the frame member.

Addition of IIOC or other connectors can be accomplished at almost any position of the frame members, as illustrated in FIG. 8. As shown, for example, connections may be made to any arbitrary location along the elongated dimension of a pultruded frame member $50^Y$ by various special purposes connectors. Connectors to drawer sub-systems can be made by a drawer connector 120, to frame mounted components by multiple pin terminals 126 of an IIOC module 121, to sub-systems connected requiring wire bus connections by a bus connector 122, and so on. Power connections can be made by a power bus connector 123. For locations where the circuit buses are located on inner wall surfaces, laser or mechanical drilling techniques can be used to produce through holes, such as through holes 125 on frame member $50^Y$, to locate and connect the connectors to the runs. Alternatively, the AC circuit buses can be located on the outer, accessible surfaces (not shown) for surface or snap mount connections directly onto the runs at appropriate locations.

To enable the various connector blocks 120-122 to establish connections to the conductors 70-74 on the outside surfaces 54 of the frame member $50^Y$, preferably spring type contacts (not shown) are provided on the surfaces of the connector blocks facing the frame member $50^Y$. The spring contacts are located so that when the connector blocks 120-122 are fastened to the frame member $50^Y$, such as by screws 128, or other fastening means, the spring contacts are brought into electrical connection with respective desired conductors of the frame member $50^Y$.

It can be seen that the frame members, in accordance with preferred embodiments of the invention enable full automation of frame assemblies, including installation of IIOC modules and interconnecting connectors, and results in frame assemblies which have extremely high reliability due to the large extent of integration possible and use of automatic assembly processes which are enabled. AC conductors can be run on the interior surfaces of the structure with ground included, thereby preventing shorting and reducing safety hazards, as well as providing ready access for module mounting and interconnection to the inner conductors, for example, with a screw, or the like. The joining and programming modules impart final mechanical strength, enabling programming by drilling or punching out selected buses to create unique IIOC nets as illustrated in FIG. 12.

The manufacturing of composite plastic frame parts by pultrusion processes as described above lends readily to the formation of non-traditional and highly featured structures. For example, a pultruded frame member 135 of rectangular shaped cross-section suitable for use as a "Smart Frame" member is shown in FIG. 9. Additionally, another pultruded frame member configuration 138 which can be employed is shown in FIG. 10. The configuration 138 of FIG. 10 provides a corner 140 that can be used to engage machine enclosing panels 141, as shown in FIG. 11, in which panels or sliding covers 141 are received and secured by members 138$^I$, 138$^{II}$, and 138$^{III}$, by screws 143, or other fastening means. Color, texture, and other aesthetic features can also be provided within members 138 by the pultrusion process.

Figure 12:
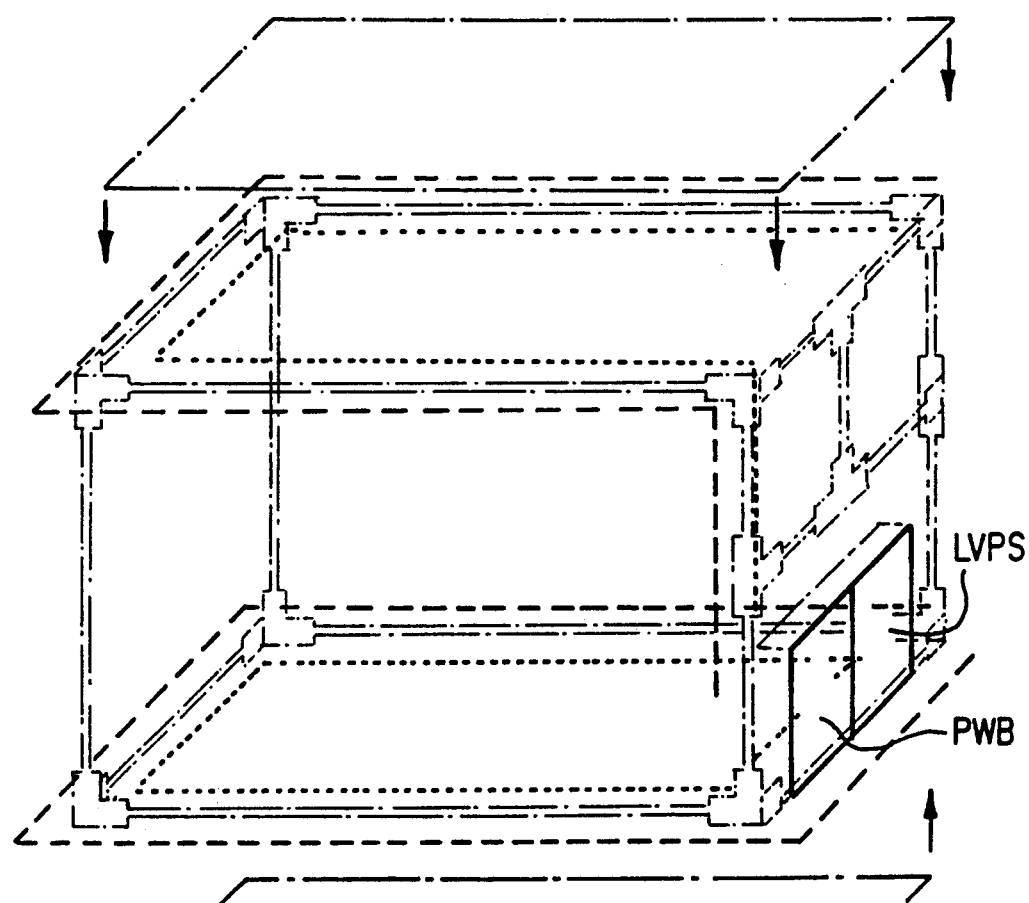
FIG. 12 is an isometric view of a "Smart Frame" nets diagram showing some possible combinations of nets routing utilizing the conductors that are fabricated on the frame member of FIG. 4.

FIG. 12 illustrates a "Smart Frame" Nets diagram in accordance with the present invention. In this figure, insert molded connections are selectively connected to pultrusions, thus creating "Nets" having differing electrical functions. The "Nets" are created in the case of both "T" and corner connections. An electrical "Net" is defined as several segments of an electrically conductive surface joined together at the same electrical potential. A "Net" is formed by selectively connecting the insert molded features of the corners and tees with the desired frame member.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A frame assembly that provides mechanical support and carries electrical conduction paths for connection to circuitry of a machine, comprising:
   a plurality of pultrusions, each including an insulating body and reinforcing fibers within said insulating body, each said pultrusion having grooves in surface portions along an elongated dimension;
   conductors on said surface portions of each said pultrusion, said conductors providing electrical conduction paths connectable to circuitry of said machine; and
   at least one connector block, said connector block being attached to at least two of said pultrusions and having conductors that contact said conductors on the surface of said at least two pultrusions when said connector block is attached to said at least two pultrusions, wherein said connector block interconnects selected conductors of said at least two pultrusions when said connector block is attached to said at least two pultrusions.

2. The frame assembly of claim 1, wherein said connector block interconnects said selected conductors by one of soldered areas, welded areas and spring contacts.

3. The frame assembly of claim 1, wherein said connector block conductors include molded conductor pattern.

4. The frame assembly of claim 3, wherein said connector block comprises a glass member filled with insert-molded conductors.

5. The frame assembly of claim 1, wherein said connector block includes insert-molded connections, said insert molded connections being selectively connected to said pultrusion, thereby creating nets having differing electrical functions.

6. The frame assembly of claim 1 wherein said connector block is of "T" shape.

7. The frame assembly of claim 1 wherein said pultrusion has an elongated dimension, wherein said reinforcing fibers include conductive fibers contained within said pultrusion along said elongated dimension.

8. The frame assembly of claim 7 wherein said reinforcing fibers are arranged in planes substantially perpendicular to said elongated dimension.

9. The frame assembly of claim 1 wherein said conductors are located in said grooves.

10. The frame assembly of claim 9 wherein said pultrusion has a hollow interior cavity, said hollow interior cavity having grooves therealong, and further comprising conductors in said grooves in said hollow interior cavity.

11. The frame assembly of claim 1 wherein each said pultrusion is a thermal setting polymer.

12. The frame assembly of claim 11 wherein said thermal setting polymer is selected from the group consisting essentially of polyester, vinyl ester, and epoxies.

13. The frame assembly of claim 11 wherein each said pultrusion is reinforced with fiberglass.

14. The frame assembly of claim 1 wherein said reinforcing fibers are conductive fibers.

15. The frame assembly of claim 14 wherein at least 5% by weight of said conductive fibers are conductive carbon fiber.

16. The frame assembly of claim 14 wherein said conductive fibers are metallized carbon fibers.

17. The frame assembly of claim 1 further comprising at least 5% by weight of said reinforcing fibers in each said pultrusion aligned essentially perpendicularly to an elongated dimension of said pultrusion.

18. The frame assembly of claim 1 wherein said conductors are copper circuit runs.

19. The frame assembly of claim 1 wherein said conductors are one of copper and tin/lead plated copper circuit runs.

20. The frame assembly of claim 1 wherein each said pultrusion has a hollow interior portion extending along the direction of fan elongated dimension of each said pultrusion.

21. The frame assembly of claim 20 wherein each said pultrusion has a generally square or rectangular cross sectional shape perpendicular to said elongated dimension.

22. The frame assembly of claim 20 further comprising conductors located within said hollow interior portion of each said pultrusion.

23. The frame assembly of claim 22 wherein said conductors within said hollow interior portion of each said pultrusion are adapted to conduct power to said circuitry of said machine.

24. The frame assembly of claim 23 wherein each said pultrusion includes through holes formed therein, said through holes enabling connection of said conductors within said hollow interior portion to connectors for conduction of power to said circuitry of said machine.

25. The frame assembly of claim 24 wherein said through holes are formed by one of laser and mechanical drilling.

26. The frame assembly of claim 1 wherein said conductors on said surface of each said pultrusion carry Integrated Input Output Connector bus signals for said circuitry of said machine.

27. The frame assembly of claim 26 wherein said at least one connector block is connected to said conductors on said surface of said at least two pultrusions, said at least one connector block carrying said Integrated Input Output Connector bus signals.

28. The frame assembly of claim 27 wherein said at least one connector block comprises a drawer connector.

29. The frame assembly of claim 27 wherein said at least one connector block comprises an Integrated Input Output Connector module having multiple pin terminals.

30. The frame assembly of claim 27 wherein said at least one connector block comprises a bus connector.

31. The frame assembly of claim 27 wherein said at least one connector block comprises a power bus connector.

32. The frame assembly of claim 27 wherein said at least one connector block includes spring contacts for connecting said at least one connector block to said pultrusion conductors.

33. The frame assembly of claim 27 wherein fastening means brings said at least one connector block into electrical connection with said conductors of said at least two pultrusions.

34. The frame assembly of claim 1, further comprising a semi-cylindrically shaped member carried by at least one of said pultrusion, said semi-cylindrically shaped member serving as a corner member on an external periphery of the machine.

35. The frame assembly of claim 34 wherein said corner member serves to secure an external machine cover.

36. The frame assembly of claim 34 wherein said corner member is aesthetically colored and textured.

37. A frame assembly that provides mechanical support and carries electrical conduction paths for connection to circuitry of a machine, comprising:
   a plurality of pultrusions, each of said pultrusions being adapted for interconnection to another of said pultrusions, each of said pultrusions including:
      an insulating body and reinforcing fibers within said insulating body, said pultrusion having a plurality of grooves in surface portions along an elongated dimension;
   a plurality of conductors in said grooves, said plurality of conductors providing electrical conduction paths for connection to circuitry of said machine, at least one of said conductors of one of said plurality of pultrusions being connectable to at least one of the conductors of another of said pultrusions; and
   at least one contact block having two ends, one of the two ends abutting at least one of the plurality of conductors on one of the plurality of pultrusions, the other of the two ends abutting at least one of the plurality of conductors on another of the plurality of pultrusions;
   wherein the two ends of the contact block are in electrical communication such that at least one of the conductors on one of the pultrusions is in electrical communication with at least one of the conductors on another of the pultrusions.

38. The frame assembly of claim 37 wherein said plurality of conductors of one of said pultrusions connect to a respective plurality of conductors of another of said pultrusions when said one and said another of said pultrusions are connected together.

39. The frame assembly of claim 37, wherein said at least one contact block is attachable to at least one of said pultrusions and has conductors that contact at least one of said conductors on said at least one pultrusion when said contact block is attached to said at least one pultrusion.

40. The frame assembly of claim 37, wherein said at least one contact block is attachable to mechanically connect at least two of said pultrusions and to electrically interconnect at least some of said conductors of said at least two of said pultrusions.

41. The frame assembly of claim 39, wherein said at least one contact block is connected to said at least one conductor by one of soldered areas, welded areas and spring contacts.

42. The frame assembly of claim 39, wherein said conductors of said at least one contact block include a molded conductor pattern.

43. The frame assembly of claim 42, wherein at least one contact wherein said block comprises a glass member filled with insert-molded conductors.

44. The frame assembly of claim 37, wherein said at least one contact block includes insert-molded connections, said insert-molded connections being selectively connected to said pultrusions, thereby creating nets having differing electrical functions.

45. The frame assembly of claim 40 wherein said at least one contact block is of "T" shape.

46. The frame assembly of claim 37 wherein said reinforcing fibers are conductive fibers.

47. The frame assembly of claim 46 wherein said conductive fibers are conductive carbon fibers.

48. The frame assembly of claim 46 wherein said conductive fibers are metalized carbon fibers.

49. The frame assembly of claim 37 wherein said pultrusions have hollow interior cavities, said hollow interior cavities having grooves therealong, and further comprising conductors in said grooves in said hollow interior cavities.

50. The frame assembly of claim 49 wherein said conductors within said hollow interior portion of said pultrusion are adapted to conduct power to said circuitry of said machine.

51. The frame assembly of claim 50 wherein said pultrusion includes through holes formed therein, said through holes enabling connection of said conductors within said hollow interior portion to connectors for conduction of power to said circuitry of said machine.

52. The frame assembly of claim 53 wherein said through holes are formed by one of laser and mechanical drilling.

53. The frame assembly of claim 37 further comprising a semi-cylindrically shaped member carried by at least one of said pultrusions, said semi-cylindrically shaped member serving as a corner member on an external periphery of the machine.

54. The frame member of claim 53 wherein said corner member serves to secure an external machine cover.

55. The frame member of claim 53 wherein said corner member is aesthetically colored and textured.

56. A frame assembly that provides mechanical support and electrical conduction paths for connection to circuitry of a reprographic copy machine, comprising:

a plurality of pultrusions, each including an insulating body and reinforcing fibers within said insulating body, each said pultrusion having grooves in surface portions along an elongated dimension of said pultrusion, and conductors in said grooves, said conductors providing electrical conduction paths connectable to circuitry of said machine; and at least one interconnect block that mechanically interconnects at least two of said pultrusions and that has at least one conductor that electrically connects selected conductors of said mechanically interconnected pultrusions.

57. The frame assembly of claim 56, wherein said interconnect block interconnects said selected conductors by soldered areas.

58. The frame assembly of claim 56, wherein said at least one conductor of said interconnect block includes a molded conductor pattern.

59. The frame assembly of claim 58, wherein said interconnect block comprises a glass member filled with insert-molded conductors.

60. The frame assembly of claim 56, wherein said interconnect block includes insert-molded connections, said insert molded connections being selectively connected to said pultrusions, thereby creating nets having differing electrical functions.

61. The frame assembly of claim 56 wherein said interconnect block is of "T" shape.

62. The frame assembly of claim 56 wherein said reinforcing fibers are contained within said pultrusions along said elongated dimension.

63. The frame assembly of claim 56 further comprising reinforcing fibers within said protrusions arranged in planes substantially perpendicular to said elongated dimension.

64. The frame assembly of claim 63 wherein at least some of said reinforcing fibers are conductive fibers.

65. The frame assembly of claim 56 wherein said grooves are aligned in surface portions of said pultrusions parallel with said elongated dimension.

66. The frame assembly of claim 65 wherein said pultrusions have a hollow interior cavity, said hollow interior cavity having grooves therealong, and further comprising conductors in said grooves in said hollow interior cavity.

67. The frame assembly of claim 66 wherein said conductors within said hollow interior portion of said pultrusions are adapted to conduct alternating current power to said circuitry of said machine.

68. The frame assembly of claim 67 wherein said pultrusions include through holes formed therein, said through holes enabling connection of said conductors within said hollow interior portion to connectors for conduction of power to said circuitry of said machine.

69. The frame assembly of claim 68 wherein said through holes are formed by one of laser and mechanical drilling.

70. The frame assembly of claim 56 further comprising a semi-cylindrically shaped member carried by at least one of said pultrusions, said semi-cylindrically shaped member serving as a corner member on an external periphery of the machine.

71. The frame member of claim 70 wherein said corner member serves to secure an external machine cover.

72. The frame member of claim 70 wherein said corner member is aesthetically colored and textured.

73. A frame assembly that provides mechanical support and carries electrical conduction paths for connection to circuitry of a machine, comprising:

a pultrusion including an insulating body and reinforcing fibers within said insulating body, said pultrusion having grooves in surface portions along an elongated dimension;

conductors on a surface of said pultrusion, said conductors providing electrical conduction paths connectable to circuitry of said machine; and at least one connector block, said connector block being attachable to said pultrusion and having conductor contacting portions for contacting said conductors when said connector block is attached to said pultrusion, wherein said connector block includes insert-molded connections, said insert-molded connections being selectively connected to said pultrusion, thereby creating nets having differing electrical functions, wherein said connector block includes at least one conductor establishing electrical communication between two ends of the connector block.

74. The frame assembly of claim 73, wherein one of the connector block ends abuts at least one of the conductors on the pultrusion, and the other of the connector block ends is adapted to abut at least one conductor of another pultrusion.

75. A frame assembly that provides mechanical support and carries electrical conduction paths for connection to circuitry of a machine, comprising:

a plurality of pultrusions, each of said pultrusions being adapted for interconnection to another of said pultrusions, each of said pultrusions including:

an insulating body and reinforcing fibers within said insulating body, said pultrusion having a plurality of grooves in surface portions along an elongated dimension; and a plurality of conductors in said grooves, said plurality of conductors providing electrical conduction paths for connection to circuitry of said machine, at least one of said conductors of one of said plurality of pultrusions being connectable to at least one of the conductors of another of said pultrusions; and at least one contact block including at least one conductor and insert-molded connections, said insert-molded connections being selectively connected to said pultrusions, thereby creating nets having differing electrical functions.

76. The frame assembly of claim 75, wherein said contact block has two ends, one of the two ends abutting at least one of the plurality of conductors of one of the plurality of pultrusions, the other of the two ends abutting at least one of the plurality of conductors of another of the plurality of pultrusions;

wherein the two ends of the contact block are in electrical communication via the at least one conductor of the contact block such that said at least one conductor of said one pultrusion is in electrical communication with said at least one conductor of said another of the pultrusions.

* * * * *